United States Patent
Gibson et al.

(10) Patent No.: US 7,154,116 B2
(45) Date of Patent: Dec. 26, 2006

(54) REWIRING SUBSTRATE STRIP WITH A NUMBER OF SEMICONDUCTOR COMPONENT POSITIONS

(75) Inventors: Gavin Gibson, Ayr (GB); Peter Ossimitz, München (DE)

(73) Assignee: Infineon Technologies AG, Munich (DE)

( * ) Notice: Subject to any disclaimer, the term of this patent is extended or adjusted under 35 U.S.C. 154(b) by 265 days.

(21) Appl. No.: 10/943,016

(22) Filed: Sep. 17, 2004

(65) Prior Publication Data

US 2005/0082667 A1    Apr. 21, 2005

(30) Foreign Application Priority Data

Sep. 18, 2003  (DE) ............................... 103 43 578

(51) Int. Cl.
*H01L 23/58* (2006.01)

(52) U.S. Cl. .................. 257/48; 257/735; 438/11; 438/460

(58) Field of Classification Search .......... 257/48, 257/735, 690, 693; 438/11, 460, 14, 15, 438/18, 68, 462, 465

See application file for complete search history.

(56) References Cited

U.S. PATENT DOCUMENTS

| 5,334,857 | A | 8/1994 | Mennitt et al. |
| 6,249,052 | B1 | 6/2001 | Lin |
| 2001/0042901 | A1 | 11/2001 | Maruyama |

FOREIGN PATENT DOCUMENTS

WO    WO 03/075344 A2    9/2003

*Primary Examiner*—Douglas W. Owens
(74) *Attorney, Agent, or Firm*—Edell, Shapiro & Finnan, LLC

(57) ABSTRACT

A rewiring substrate strip with a number of semiconductor component positions and semiconductor components, which are arranged in rows and columns on the rewiring substrate strip also includes are concealed contact lands arranged in sawing tracks between the semiconductor component positions. The concealed contact lands are connected by rewiring leads both to the external contacts of the product package and to contact areas of the semiconductor chips of the semiconductor components.

19 Claims, 4 Drawing Sheets

REWIRING SUBSTRATE STRIP WITH A NUMBER OF SEMICONDUCTOR COMPONENT POSITIONS

CROSS REFERENCE TO RELATED APPLICATIONS

This application claims priority under 35 USC § 119 to German Application No. DE 103 43 578.6 filed on Sep. 18, 2003, and titled "Rewiring Substrate Strip with a Number of Semiconductor Component Positions," the entire contents of which are hereby incorporated by reference.

FIELD OF THE INVENTION

The invention relates to a rewiring substrate strip with a number of semiconductor component positions and to semiconductor components of the rewiring substrate strip, which are arranged in rows and columns on the rewiring substrate strip.

BACKGROUND

For semiconductor components, it is increasingly end desirable to minimize the size of the product package that is produced. For this purpose, the number of external contacts is reduced to a minimum. It is also desirable to avoid as many external contacts as possible of a semiconductor component, which have previously been provided for test purposes, optimization purposes, and analysis purposes. Such a reduction in the number of external contacts correlates to external contacts for internal test and analysis purposes no longer being provided externally on the package. Although this results in smaller packages, there are also significant restrictions in the suitability of such semiconductor components for analysis and testing. The associated risks with respect to the yield of serviceable semiconductor components from a rewiring substrate strip cannot be lessened by further improved production processes.

Furthermore, the testing of semiconductor components by contacting their remaining external contacts by probe tips presents a further problem. It is not possible to rule out the possibility of external contacts being damaged or deformed by probe tips. Damage or deformation of external contacts can lead to problems when carrying out soldering during further processing. A transfer of soft material of the external contacts to the hardened measuring contacts is not ruled out in this case, and may lead to contamination caused by residues, which can cause problems in testing.

A rewiring strip with a number of semiconductor component positions, which can overcome the above problems, is desirable. Also, in spite of the reduced number of external contacts and reduced package size, a suitability for analysis and testing with respect to internal signals for process optimisation, for correlation with other forms of package, and for characterization of the semiconductor components is desirable. In addition, tests that are possible without damaging or deforming external contacts are desirable. A simple and low-cost way of mechanically and electrically contacting semiconductor components or semiconductor modules of large-scale integrated circuits for a "burn-in" test is desirable.

SUMMARY

A rewiring substrate strip with a number of semiconductor component positions for semiconductor components is provided. For this purpose, the rewiring substrate strip has a number of semiconductor chips arranged in rows and columns in the semiconductor component positions, which are embedded under a common plastic covering on regions of an upper side of the rewiring substrate strip. One or more such plastic coverings are arranged one behind the other and/or next to each other on the rewiring substrate strip with external contact lands. The external contact lands have external contacts and are arranged in the component positions on the rear side of the rewiring substrate strip opposite from the upper side. The external contact lands are electrically connected on this rear side of the rewiring substrate strip to rewiring leads and/or to concealed contact lands, which are arranged in sawing tracks between the component positions on the rear side of the rewiring substrate strip.

With such a rewiring substrate strip, the sawing tracks can be used to minimize the external contacts of the product package and permit complete testing of internal components of the integrated circuits. The remaining external contact lands can then be limited or reduced to the number of external contacts necessary for the sales product. The rewiring leads and/or the concealed contact lands in the sawing tracks provide adequate access possibilities to allow internal signal tests and analyses to be performed on each of the semiconductor chips. In addition, through the concealed contact lands, testing the semiconductor component functions by placing tips on the external contacts can be avoided, since the concealed contact lands are available and can be connected by rewiring leads to test areas on the rewiring substrate strip.

Exposed probing pads may be arranged on the rear side, outside the region of the plastic coverings. The probing pads are in electrical connection with rewiring leads and/or with the concealed contact lands in the sawing tracks and/or with the external contact lands of the semiconductor components and/or with contact lands on the semiconductor chip. A rewiring substrate strip has relatively more surface area for rewiring than the region underneath the plastic covering. Furthermore, probing pads for measurements and tests not previously envisaged can be provided in addition on the rewiring substrate.

Probing pads are in connection with the concealed contact lands in the sawing tracks by rewiring leads. Concealed contact lands may have dimensions in the micrometer range. The probing pads outside the plastic coverings do not have to have such small surface areas, so relatively large probing pads may be present. This facilitates the attachment of probing tips for testing the semiconductor component. Also, no probing tips can be placed onto the actual external contacts of the semiconductor component product or the product package. This largely avoids the risk of damage or deformation of external contacts of the product package.

Furthermore, the rewiring substrate strip may have, in an edge region, a multipole connector with plug contact areas. The plug contact areas may be arranged on the rear side and/or the front side of the rewiring substrate strip. The plug contact areas may be in electrical connection with the probing pads and/or the concealed contact lands and/or the external contact lands. Such a multipole connector in the edge region of the rewiring substrate strip facilitates the docking on of the rewiring substrate strip, for example, onto a test system with extreme temperature cycles, as occur in "burn-in" tests. Further test leads, which permit internal signal tests and analyses, can be placed on the plug contact areas of the multipole connector. At the same time placement of the finished semiconductor components on a separate test substrate for the "burn-in" test can be dispersed, and at the same time to permit a "burn-in" test simultaneously for a number of semiconductor components under a common plastic covering on a rewiring substrate strip.

In another embodiment of the invention, the rewiring substrate strip has plastic coverings with semiconductor component positions with sawing strips. The width of the sawing strip is greater than a sawing track being arranged between the semiconductor component positions. The sawing strip has exposed probing pads. By providing such sawing strips, instead of concealed contact lands in the micrometer range, exposed probing pads with a side edge length in the range of several tens of micrometers can be provided. In addition, the number of exposed probing pads may be increased as desired, by further increasing the width of the sawing strips.

Such probing pads may also carry probing contacts, which significantly facilitates access with the aid of probing tips. No external contacts of the product package have to be contacted, provided that the probing contacts and their probing pads are connected by corresponding rewiring leads to the external contact lands or the external contacts of the product package. A further possibility is that, instead of probing contacts on the probing pads, the probing pads are treated with a gold coating. With such a gold coating, the probing tips are not contaminated when placed onto the probing pads as in the case of probing contacts of soft solder, or deposits, which can cause considerable problems during subsequent tests, remain on the probing tips.

Furthermore, the rewiring strip has, in the semiconductor component positions, stacks including at least one logic chip and/or one memory chip. By the exposed probing pads and/or the probing contacts and/or the plug contact areas, both the memory functions of memory chips and the logic functions of logic chips can be tested. In particular, in the case of memory chips with a high storage density, i.e., above several hundred megabytes and into the gigabyte range, with the rewiring substrate strip according to the invention, such complex stacks including a memory chip and a logic chip can be tested in detail before such complex stacks of semiconductor component structures are delivered. This increases the reliability of the semiconductor components and reduces the reject rate of semiconductor components on a rewiring substrate strip according to the invention. The rewiring substrate according to the invention makes such extensive tests possible providing additional testing areas, which previously could not be provided.

The invention also relates to a semiconductor component, which is formed by cutting up the rewiring substrate strip according to the invention. Such a semiconductor component differs from conventional semiconductor components in that severed rewiring leads occur on its edge sides. To avoid corrosive attacks of the severed rewiring leads on the edge sides, in an embodiment of the semiconductor components, the edge sides may have an insulating plastic coating, for example, thin layers of lacquer applied to the edge sides.

A method for producing a rewiring substrate strip with a number of plastic coverings on its upper side, which have semiconductor component positions with semiconductor chips arranged in rows and columns, can include the following steps. Firstly, a substrate strip is provided. Such a substrate strip may include a synthetic resin film or sheet in strip form metalized on one or both sides. While the upper side of the substrate strip is intended for semiconductor chips in semiconductor component positions, a rewiring pattern with external contact lands in the semiconductor component positions is applied to the rear side of the substrate strip. In addition, concealed contact lands and/or rewiring leads between the component positions are arranged in the region of sawing tracks.

Both in the edge regions of the substrate strip and between the plastic coverings on the substrate strip, which are provided on the upper side for a number of component positions, there are areas which have probing pads and/or plug contact areas on the rear side of the rewiring substrate strip probing pads and/or plug contact areas outside the regions of the plastic coverings provided. In addition, rewiring leads are provided on the rear side of the rewiring substrate strip between the external contact lands, the concealed contact lands, the probing pads, and/or plug contact areas.

Once such a rewiring pattern is completed on the rear side of the rewiring substrate strip, semiconductor chips are applied to the upper side of the rewiring substrate strip in the semiconductor component positions. In the process, connections are established between the semiconductor chips on the upper side and the rewiring pattern on the rear side. Subsequently, the intended plastic coverings are applied to the semiconductor chips. Finally, external contacts can also be applied in the semiconductor component positions to the external contact lands of the rewiring pattern on the rear side of the rewiring substrate strip.

Subsequently, the implementation of functional tests of the semiconductor chips embedded in the plastic coverings is performed by contacting the probing pads and/or the plug contact areas. After the functional tests, defective semiconductor components on the rewiring substrate strip are identified.

Due to the additional probing pads and/or plug contact areas on the rear side of the rewiring substrate strip, implementation of functional tests of the embedded semiconductor chips is possible without the external contacts on the rewiring substrate strip being contacted. In addition, the internal signal processing in the semiconductor chips arranged underneath the plastic covering can also be tested without additional external contacts for the product package being required.

Components, which have packages of a reduced size, can be produced, while reducing the number of external contacts, and undergo a complete functional test, even for the internal signal processing. In addition, the arrangement of plug contact areas allows a "burn-in" cycle to be performed. The semiconductor components can be tested under exposure to extremely fluctuating temperatures even before the plastic coverings are cut up into individual semiconductor components.

Safeguarding the external contacts of the product package, the possibility of testing and analyzing internal signal variations of the semiconductor chips, and testing each plastic covering with a number of semiconductor components within the plastic covering under extreme temperature fluctuations become possible with the rewiring substrate strip according to the invention.

Instead of sawing tracks, which allow a limited number of concealed contact lands and have dimensions in the micrometer range, sawing strips with probing pads and/or probing contacts are provided. Some of the probing pads and/or probing contracts are connected by rewiring leads to the external contact lands. These sawing strips are sawn out during the individual separation of the semiconductor components so that the product package remain small, since the probing contacts are removed from the debug package with the sawing strip.

As probing contacts, solder balls are, for example, soldered onto the probing pads. These solder balls are also no longer a component part of the product package after removal of the sawing strips. As a result the product package can be made correspondingly small. These solder balls serve for the functional testing of the packaged semiconductor chips and are not provided as external contacts of the product package.

Furthermore, the probing pads and/or the plug contact areas and/or the external contact lands of the rewiring pattern are selectively coated with a gold alloy. Such a coating can be applied relatively simultaneously for the freely accessible contact areas. In addition, with the coating, in the individual functional tests, no residues of the metal remain on the corresponding probing tips.

To produce semiconductor components, based on the rewiring substrate strip according to the invention, cutting up into individual semiconductor components is carried out once the functional test has been performed, thus, segregating the marked defective component positions. This creates components which have severed rewiring leads on edge sides, which can be protected by applying a plastic package layer to the edge sides.

The rewiring substrate strip according to the invention makes it possible to implement optimized adaptation of the wiring for a wide variety of test requirements already on the substrate. This allows the contact unit or the multipole connector to form a uniform interface for functional tests and analyses. Independently of the package, the interface can be designed with respect to the availability and position of the external contacts.

Finally, damage to external contacts can be prevented by the rewiring substrate strip according to the invention. Furthermore, contacting of probing pads can be accomplished without applied probing contacts. Furthermore, grouping together of specific signaling and supply leads to the probing pads or plug contact areas can already be accomplished in the rewiring substrate strip.

The sawing of the rewiring substrate strip into individual packages then allows the additional contacting possibilities, such as concealed contact lands, probing pads and/or plug contact areas, to be removed and consequently to have relatively no influence on use in the application. This additional functionality of the rewiring substrate strip according to the invention is achieved by an altered layout, without causing additional production costs.

The electrical interface achieved with the probing contacts or the plug contact areas is also suitable for a simultaneous "burn-in" test of a number of semiconductor components under a plastic covering. To apply the additional test contact areas or probing lands and the additional rewiring leads to the rewiring substrate strip, the surface area between the later packages of the semiconductor components, which is usually provided by sawing tracks, is used.

In particular, the invention facilitates a time-intensive memory test when implementing DRAMs in a corresponding package. For optimized implementation of this test, a solution using a scanning test in the form of the BIST test (boundary scan test) is provided. The small number of necessary probing contacts for this test is made possible by the use of a JTAG-IF as the test interface, and the test costs are reduced by maximized parallelism.

For more extensive tests, which possibly require electrical contact with further probing pads which cannot be wired in the sawing frame, a second test area insertion with fewer devices tested in parallel is introduced. In these tests, probing contacts in the form of solder balls are then used instead of the probing pads between component positions. Depending on the detailed partitioning of the tests, a combination of the two contacting methods with solder balls and with probing pads is also possible with the rewiring substrate strip according to the invention.

When applying additional probing contacts to the probing pads, the packages, which are located under a mold cap or a plastic package, are provided with additional rows of solder contacts. These solder contacts are used as an extended external interface for the functional testing of the semiconductor components. An analysis and characterization and a test of the semiconductor chips can be accomplished in spite of the product package with a reduced surface area and a reduced number of external contacts. The rows of solder balls additionally applied for the tests as probing contacts can be removed after the functional tests. The arrangement of the additional rows of solder balls on one or two of the edges of the semiconductor component positions allows the sawing process to be optimized. Consequently, there are various advantageous solution proposals within the scope of this invention for applying the probing contacts.

Packages are provided with the additional solder balls. Depending on the chosen sawing line or sawing track, production packages or debug packages are cut out of the rewiring substrate strips. The debug package includes in addition to the product package probing contact lands and/or additional probing contacts, which are provided in sawing strip regions of the plastic coverings. In a further production step, the debug package may finally be cut appropriately to form a product package by cutting off the probing pads or the probing contacts.

To minimize the loss of surface area under the mold cap or the plastic covering, the number of rows of semiconductors can be reduced with a debug package.

Furthermore, the construction of a straightforward product package can be accomplished along with the debug package on a rewiring substrate strip. In this case, part of the package is suitable for the production test, but not for the analysis and characterization.

Similarly, a variation of the rewiring substrate strip with or without a debug package can be implemented as an optimisation step.

For trimming, the debug packages are applied to an additional film in the same way as when sawing the wafers and when sawing the rewiring substrate strip. To support the narrow edges, if need be additional packages or dummy modules are adhesively attached laterally to the sawing frame. The introduction of this additional production step may possibly have to be tried out in series of trials.

With the rewiring substrate strip according to the invention, the variation of the package form by using different sawing lines when dividing it up is possible. Consequently, a rewiring substrate strip can produce different packages. Furthermore, with the rewiring substrate strip according to the invention, an extensive electrical assessment of the internal signals in the package is possible.

The rewiring substrate strip according to the invention or the method for producing components with the substrate strip can provide that the contacts for the "burn-in" test can be established directly on the rewiring substrate strip before sawing by the contact strips provided. For this purpose, the required connections of the component are routed to the contact strip. The number of necessary connections for the individual integrated circuit can be minimized by suitable measures. As a result, use of the available wiring area of the substrate strip that optimizes the surface area is possible.

Tracing back of the components, in particular, the components which do not operate, is also made easier with the aid of the multipole connector.

Consequently, the rewiring substrate strip is used as a mechanical and electrical unit for the "burn-in". The rewiring between the semiconductor component and the multipole connector takes place between the final package substrates. The use of the most favorable multipole connector as a contacting unit for the parallel "burn-in" and test consequently becomes possible. This makes it possible to use a standard interface, and consequently a standard "burn-in board" for different components.

BRIEF DESCRIPTION OF THE DRAWINGS

The invention is now explained in more detail based on the accompanying drawings.

DETAILED DESCRIPTION

Figure 1:
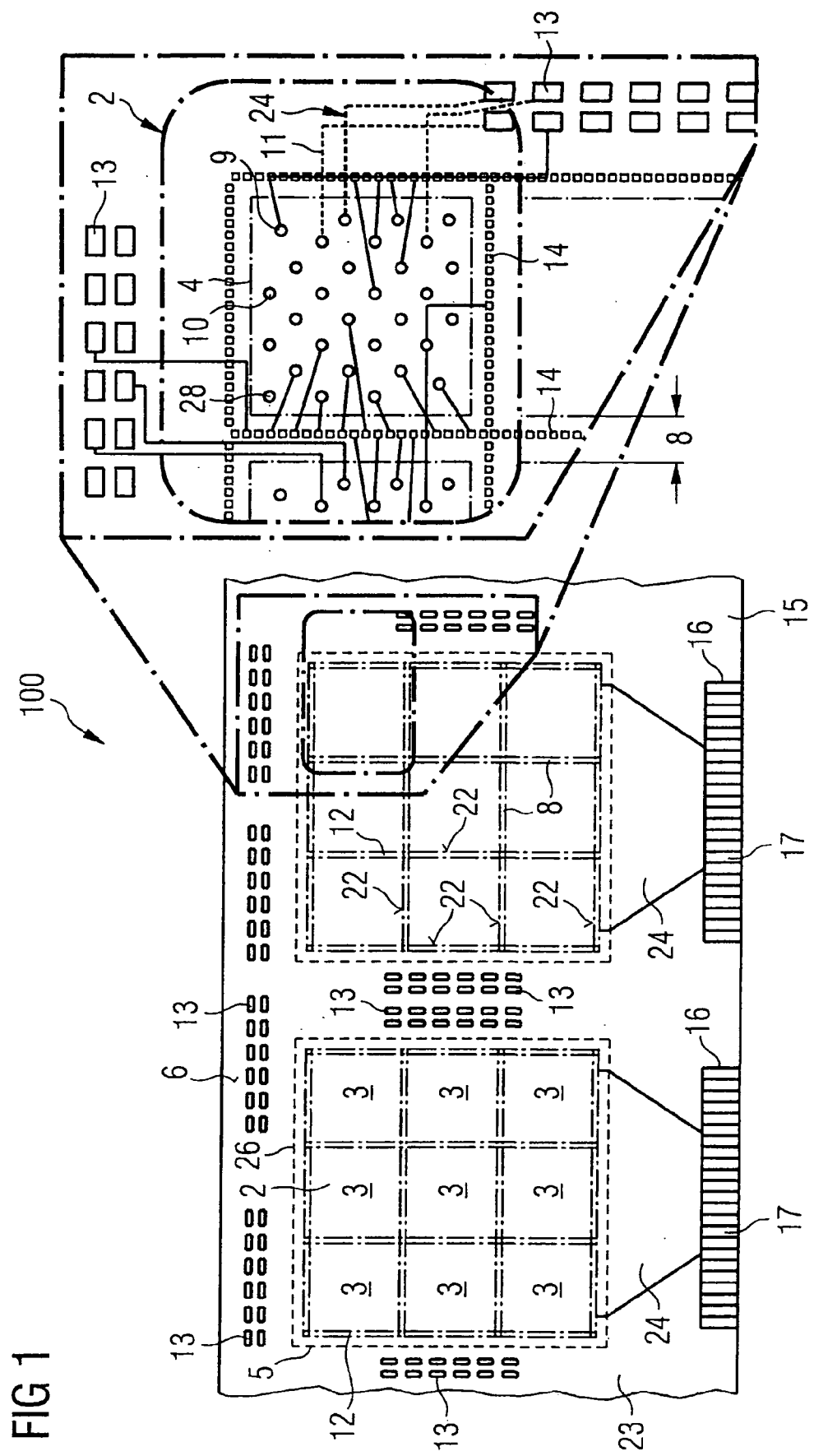
FIG. 1 shows a basic diagram of a first embodiment of the invention.

FIG. 1 shows a basic diagram of a first embodiment of the invention. Of a rewiring substrate strip 100, the rear side of part of the substrate strip can be seen in FIG. 1. The outlines of two plastic coverings 5, arranged one behind the other, are shown by dashed lines, since the plastic coverings for a number of component positions are arranged on the upper side, opposite from the rear side 6 depicted here of the rewiring substrate strip 100.

In the case of this embodiment of the invention, nine packages (3×3) for nine semiconductor components 3 are provided in each region of a plastic covering 5 under a mold cap or plastic covering 5 of 43×43 mm$^2$. In this matrix, the semiconductor component positions 2 are respectively arranged in rows and columns. In order to divide the rewiring substrate strip 100 into individual semiconductor components 3, eight sawing tracks 12 are provided. Arranged in the regions 8 of the sawing tracks 12 are small concealed contact lands 14 of a few micrometers. These become visible with the enlargement drawn out to the right in FIG. 1.

While a matrix of external contact lands 10 with external contacts 9 arranged on them in the form of solder balls 28 is arranged within a semiconductor component position 2, in a sawing track 12 there are a number of closely packed buried or concealed contact lands 14 a few micrometers in size, some of which are connected by means of rewiring leads 11 to the external contacts 9 and some of which are connected to internal contact areas (not shown here) of the semiconductor chip 4 arranged on the upper side. From the rear side 6, vias (not shown) are appropriately provided to the upper side of the rewiring substrate strip 100, with the result that the relatively high number of concealed contact lands 14 a few micrometers in size provide access to the signaling leads of the individual semiconductor chips in the semiconductor component positions 2.

A number of external contact lands 10 may also be brought together by rewiring leads 11 in the sawing track 12, if the corresponding external contacts 9 have a common potential. From the concealed contact lands 14 a few micrometers in size, rewiring leads 11 extend not only to the external contact lands 10 under the semiconductor chip, but also to probing pads 13, which are arranged outside the mold cap or plastic covering 5, shown by dashed lines, for a number of semiconductor components 3. These probing pads 13 may be arranged around such a plastic covering 5 and have a size which can be contacted without any problems by appropriate probing tips. Accordingly, it is not necessary to contact the external contacts 9 in the form of solder balls with probing tips for a test, but instead the probing pads arranged in the outer regions can be contacted without damaging the external contacts 9 of the semiconductor component 2. In addition, probing and testing of further internal signaling leads of the semiconductor chips is possible by the probing pads 13 next to the external contacts 9 of the semiconductor components 3.

Apart from the probing pads 13, which are arranged outside the plastic coverings 5, the substrate strip 23 has in an edge region 15 multipole connectors 16 with plug contact areas 17. On these plug contact areas 17, test circuits or test connections can be connected by means of rewiring leads to components of the semiconductor chips which have to be investigated under extremely fluctuating temperatures, as are used in the "burn-in" test. With this multipole connector 16, nine semiconductor components 3 of a plastic covering 5 can be simultaneously tested directly on the rewiring substrate strip 100 according to the invention in a burn-in oven, before being sawn apart.

When the semiconductor component positions 2 are cut up into individual semiconductor components 3, rewiring leads 11 are severed on the edge sides 22 of the semiconductor components 3 by the sawing tracks 12 and are subsequently protected by a layer of lacquer.

Figure 2:
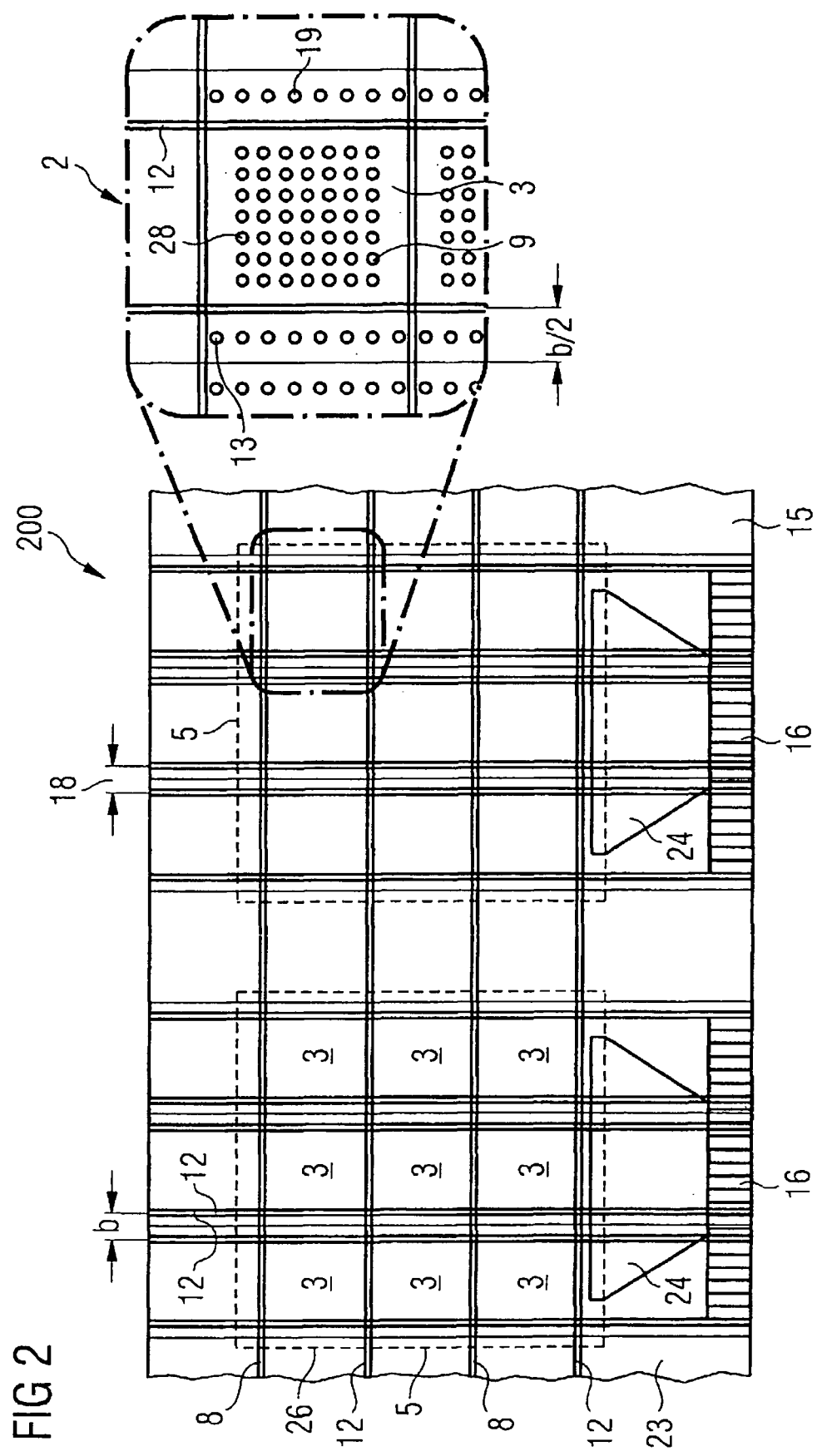
FIG. 2 shows a basic diagram of a second embodiment of the invention.

FIG. 2 shows a basic diagram of a second embodiment of the invention. Components with the same functions as in FIG. 1 are identified by the same designations and are not separately discussed. In FIG. 2 also, the rear side 6 of a rewiring substrate strip 200 is shown, and two regions 26 of plastic coverings 5, which are arranged on the opposite upper side of the rewiring substrate strip 200, are shown by dashed lines. While sawing tracks 12, which have a narrow region 8 per sawing track 12, are provided in the longitudinal direction of the rewiring substrate strip 200, as in FIG. 1, sawing strips 18, which are respectively bounded by two sawing tracks 12, are provided in the transverse direction with respect to the rewiring substrate strip.

In the wider region of the sawing strips 18, it is then possible not only to provide concealed contact lands a few micrometers in size, but also to arrange large-area probing pads 19 with corresponding probing contacts in the form of solder balls 28. In this second embodiment of the invention, according to FIG. 2, an additional row of probing contacts 19 is respectively provided for each of the semiconductor components 3, permitting decisive functional tests. Consequently, with this embodiment of the invention, apart from the probing pads shown in FIG. 1 and the multipole connectors 16 also indicated here, differentiated probing and testing of the semiconductor components 3 of a plastic covering 5 can additionally be carried out by the probing contacts 19 before the probing contracts 19 are cut up into individual semiconductor components 3.

Figure 3:
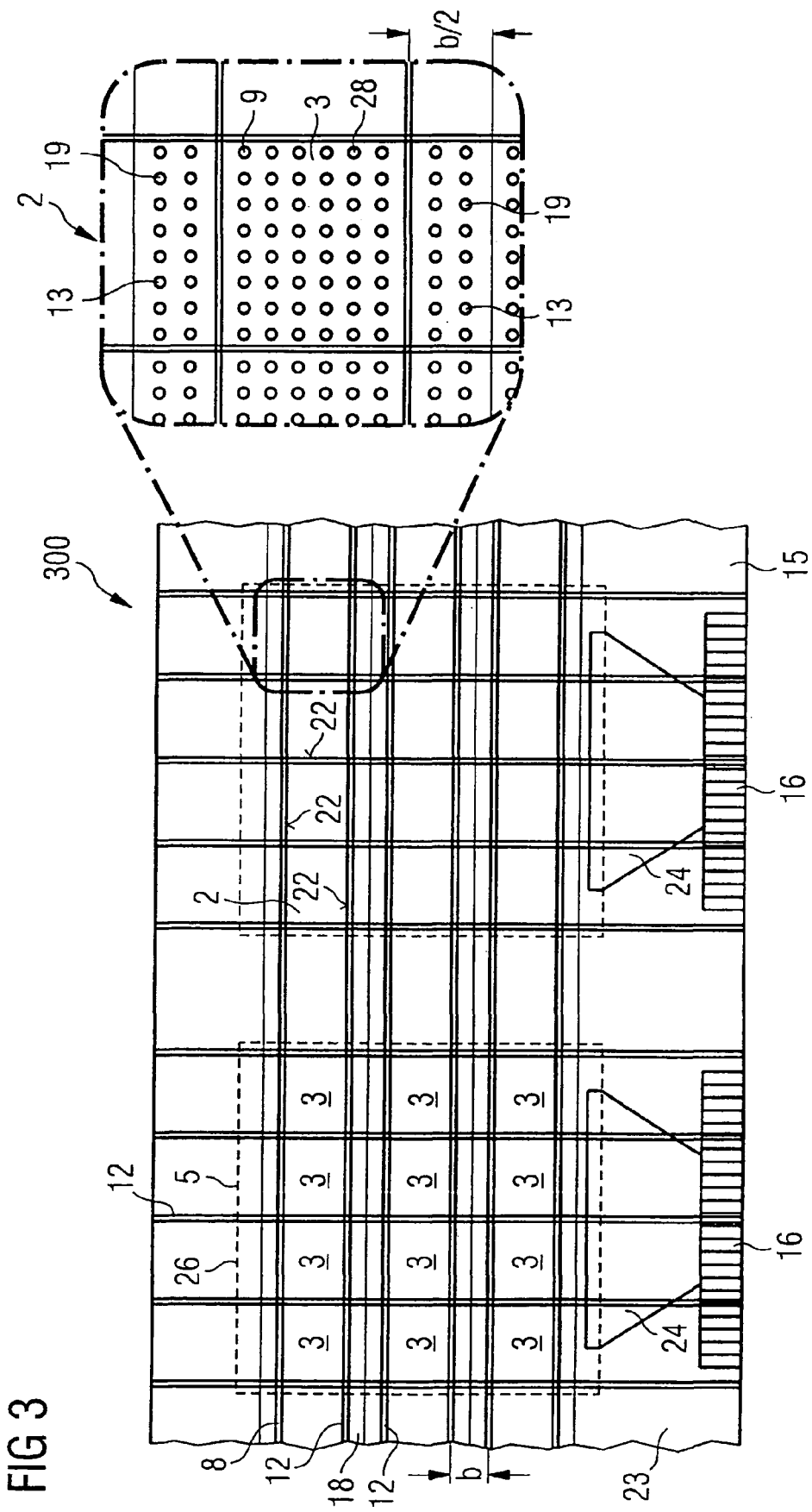
FIG. 3 shows a basic diagram of a third embodiment of the invention.

FIG. 3 shows a basic diagram of a third embodiment of the invention. Components with the same functions as in the previous figures are identified by the same designations and are not separately discussed. The rewiring substrate strip 300 of the third embodiment of the invention according to FIG. 3 differs from the second embodiment according to FIG. 2 in that sawing tracks 12 are provided in the transverse direction, while sawing strips 18 with a width b are then arranged in the longitudinal direction. These sawing strips 18 are respectively bounded by two sawing tracks 12 and accommodate up to four rows of probing contacts 19. This achieves the effect that each semiconductor component position 2 is provided with twice the number of probing contacts 19 in comparison with the second embodiment according to FIG. 2.

Here, too, concealed contact lands a few micrometers in size may be additionally provided, interacting with probing pads (not shown here) outside the region 26 of a plastic covering 5 that is indicated by dashed lines. A multipole connector 16 for each plastic covering 5 with twelve semiconductor components 3 is also provided in the case of this rewiring substrate strip 300. Apart from the implementation shown here of in each case two additional rows of probing contacts with respect to the external contacts 9 of the product package, in principle, three additional rows of solder balls (not shown here) are possible at corresponding X and Y edges of the final semiconductor component 3. The target product package has a size of 10×12 mm² and consequently twelve packages can be produced under a plastic covering 5 of 43×43 mm.

In practice, however, it tends to be more appropriate to integrate one additional row of solder balls parallel to each of the two opposite rows of solder balls of the product package, as provided in the second embodiment according to FIG. 2. In this way, as shown here, 2×23 solder balls can be additionally provided for each of the semiconductor components 3. This means that the 42 internal signals currently to be tested can be externally contacted at the solder balls in the debug package.

On the other hand, it is envisioned to reduce the size of the product package to 10×10 mm, with the result that 4×4=16 packages, and consequently also sixteen component positions 2, can be created thereby under a plastic covering 5. For the integration of a debug package, only 3×4=12 packages are constructed in the third embodiment, as can be seen in FIG. 3; the additional 10 mm are used for the implementation of the required probing contacts 19 in the form of solder balls on both sides along the components. Consequently, the internal signals to be tested are available externally. With a design of a rewiring substrate strip as shown in FIG. 3, the number of available packages is reduced by 25%, i.e., is reduced to only 12 packages instead of 16 packages. Given stable production, by dispensing with the debug connections it is possible to change over from the 3×4 design to the optimum 4×4 design of a rewiring substrate strip. For the embodiments of the invention represented in FIG. 2 and FIG. 3, the additional sawing to reduce a debug package to a product package is possible. The debug package can also be used directly as a further package variant for applications with an external memory interface.

Figure 4:
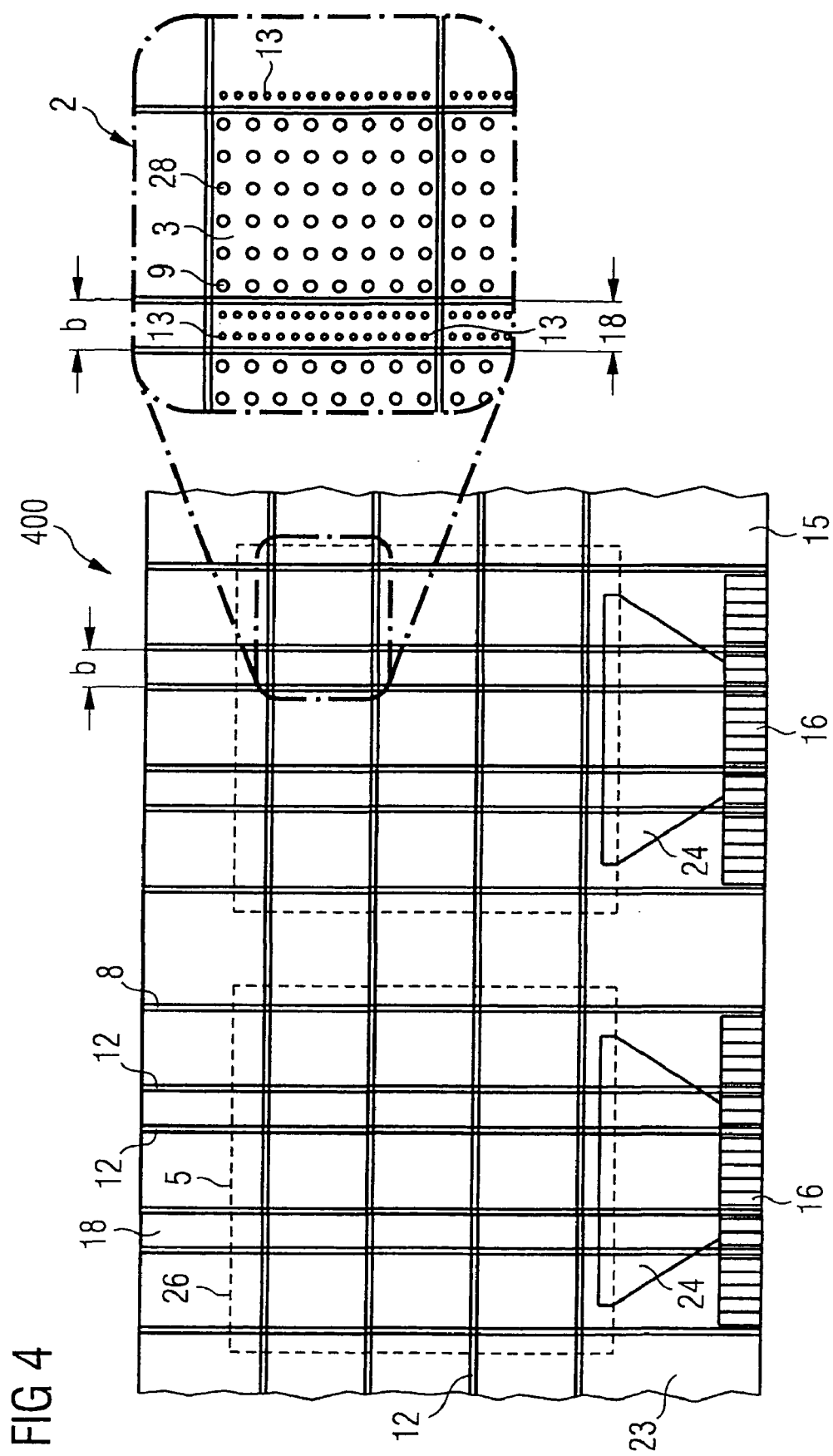
FIG. 4 shows a basic diagram of a fourth embodiment of the invention.

FIG. 4 shows a basic diagram of a fourth embodiment of the invention. Components with the same functions as in the previous figures are identified by the same designations and are not separately discussed. The embodiment of the rewiring strip 400 of FIG. 4 corresponds in its arrangement of the sawing tracks 12 and the sawing strips 18 to the second embodiment of the invention. However, instead of probing contacts in the form of solder balls, in the case of this embodiment of the invention probing pads 13 are provided in the region of the sawing strips, as shown by the enlargement of a semiconductor component position 2 drawn out to the right. Consequently, a row of probing pads 13 is respectively arranged on both sides of each semiconductor component 3. With the aid of these probing contacts 13 between the semiconductor component positions 2, it is possible to lead these probing pads 13 through for testing functional properties of the semiconductor chips in the respective semiconductor component positions 2.

In addition, a gold layer of a gold alloy on the probing pads 13 can additionally guard the probing tips against residues, with the result that reliable testing is possible. In addition, on account of the low contact resistance, a gold coating has the effect that the test results are more reliable than in the case of probing contacts comprising solder balls, with which the probing tips often have to penetrate oxide films before a definite test result can be achieved.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF DESIGNATIONS 100, 200,
300, 400 rewiring substrate strip
2 semiconductor component position
3 semiconductor component
4 semiconductor chip
5 plastic covering
6 rear side of rewiring substrate strip
8 region of the sawing tracks
9 external contacts
10 external contact lands
11 rewiring leads
12 sawing tracks
13 probing pads
14 concealed contact lands
15 edge region of the rewiring substrate strip
16 multipole connector
17 plug contact areas
18 sawing strip
19 probing contacts
22 edge sides of the semiconductor component
23 substrate strip
24 rewiring pattern
26 region of the plastic covering
28 solder ball
b width of the sawing strip

We claim:

1. A rewiring substrate strip, comprising:
   a number of semiconductor component positions for semiconductor components;
   a number of semiconductor chips arranged in rows and columns, the semiconductor chips being embedded in a common plastic covering on regions of an upper side of the rewiring substrate strip; and
   at least one plastic covering being arranged one behind the other and/or one next to the other on the rewiring substrate strip,
   wherein the external contact lands have external contacts, the external contacts being arranged in the semiconductor component positions on a rear side of the rewiring substrate strip opposite from the upper side, the external contact lands being in electrical connection with rewiring leads and/or with concealed contact lands, which are arranged in sawing tracks between the semiconductor component positions on the rear side.

2. The rewiring substrate strip as claimed in claim 1, wherein the rewiring substrate strip has regions with exposed probing pads on its rear side, outside the region of the plastic coverings, the probing pads being in electrical connection with rewiring leads and/or with the concealed contact lands in the sawing tracks and/or with the external contact lands of the semiconductor components and/or with contact lands on the semiconductor chips.

3. The rewiring substrate strip as claimed in claim 2, wherein the probing pads carry probing contacts.

4. The rewiring substrate strip as claimed in claim 2, wherein the probing pads have a gold coating.

5. The rewiring substrate strip as claimed in claim 1, wherein the rewiring substrate strip has a multipole connector with plug contact areas in an edge region, the plug contact areas being in electrical connection with the probing pads and/or the concealed contact lands and/or the external contact lands.

6. The rewiring substrate strip as claimed in claim 5, wherein the multipole connector is provided on the rear side and/or the front side of the rewiring substrate strip for a fluctuating temperature test or a "burn-in" test.

7. The rewiring substrate strip as claimed in claim 5, wherein the probing pads carry probing contacts.

8. The rewiring substrate strip as claimed in claim 5, wherein the probing pads have a gold coating.

9. The rewiring substrate strip as claimed in claim 1, wherein the rewiring substrate strip has plastic coverings with semiconductor component positions, a width of a sawing strip being greater than a sawing track, the sawing strips being arranged between the semiconductor component positions, the sawings strip having exposed probing pads.

10. The rewiring substrate strip as claimed in claim 9, wherein the probing pads carry probing contacts.

11. The rewiring substrate strip as claimed in claim 9, wherein the probing pads have a gold coating.

12. The rewiring substrate strip as claimed in claim 1, wherein the rewiring substrate strip has stacks in the semiconductor component positions, the stacks including at least one logic chip and/or one memory chip for testing both the memory functions of the memory chip and the logic functions of the logic chip by the exposed probing pads and/or the probing contacts and/or the plug contact areas.

13. A semiconductor component formed by cutting up the rewiring substrate strip as claimed in one of claim 1, the semiconductor component having severed rewiring leads on its edge sides.

14. A method for producing a rewiring substrate strip with a number of plastic coverings on its upper side, which have semiconductor component positions with semiconductor chips arranged in rows and columns, comprising:
providing a substrate strip, the substrate strip being metal-coated at least on a rear side;
applying a rewiring pattern to the metal-coated rear side of the substrate strip with external contact lands in the semiconductor component positions, concealed contact lands and/or rewiring leads in the region of sawing tracks between the semiconductor component positions, exposed probing pads outside the region of plastic coverings, provided on the upper side, and/or plug contact areas in edge regions of the rewiring substrate strip for each plastic covering, and with rewiring leads between external contact lands, concealed contact lands, probing pads and/or plug contact areas;
applying semiconductor chips to the upper side of the rewiring substrate strip in the semiconductor component positions establishment of connections between the semiconductor chips and the rewiring pattern;
applying plastic coverings to the semiconductor chips;
applying external contacts in the semiconductor component positions to the external contact lands of the rewiring pattern on the rear side of the rewiring substrate strip;
implementing functional tests of the semiconductor chips embedded in the plastic coverings by contacting the probing pads and/or the plug contact areas; and
identifying defective semiconductor components on the rewiring substrate strip.

15. The method as claimed in claim 14, wherein sawing strips include probing pads and/or probing contacts arranged thereon, some of the probing pads and/or probing contacts being connected by rewiring leads to the external contact lands, the probing pads and/or probing contacts being provided instead of sawing tracks.

16. The method as claimed in claim 14, wherein a form of package with an attached sawing strip is sawn from the rewiring substrate strip as a debug package and/or a form of package without a sawing strip is cut out from the rewiring substrate strip as a product package.

17. The method as claimed in claim 14, wherein the probing pads and/or the plug contact areas and/or the external contact lands of the rewiring pattern are selectively coated with a gold alloy.

18. The method as claimed in claim 14, wherein solder balls are soldered onto the probing pads as probing contacts.

19. A method for producing semiconductor components, comprising:
producing a rewiring substrate strip, the producing including
providing a substrate strip, the substrate strip being metal-coated at least on a rear side;
applying a rewiring pattern to the metal-coated rear side of the substrate strip with external contact lands in the semiconductor component positions, concealed contact lands and/or rewiring leads in the region of sawing tracks between the semiconductor component positions, exposed probing pads outside the region of plastic coverings, provided on the upper side, and/or plug contact areas in edge regions of the rewiring substrate strip for each plastic covering, and with rewiring leads between external contact lands, concealed contact lands, probing pads and/or plug contact areas;
applying semiconductor chips to the upper side of the rewiring substrate strip in the semiconductor component positions establishment of connections between the semiconductor chips and the rewiring pattern;
applying plastic coverings to the semiconductor chips;
applying external contacts in the semiconductor component positions to the external contact lands of the rewiring pattern on the rear side of the rewiring substrate strip;
implementing functional tests of the semiconductor chips embedded in the plastic coverings by contacting the probing pads and/or the plug contact areas; and
identifying defective semiconductor components on the rewiring substrate strip;
cutting the rewiring substrate strip into individual components; and
segregating the semiconductor components marked as defective.

* * * * *